(12) United States Patent
Lee

(10) Patent No.: US 6,476,475 B1
(45) Date of Patent: Nov. 5, 2002

(54) STACKED SRAM DIE PACKAGE

(75) Inventor: Melissa Siow-Lui Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,779

(22) Filed: Jun. 28, 2001

Related U.S. Application Data

(60) Provisional application No. 60/214,730, filed on Jun. 29, 2000.

(51) Int. Cl.[7] .......................... H01L 23/02; H01L 21/00; H01L 21/44; H01L 21/48; H01L 21/50
(52) U.S. Cl. ............................... 257/686; 438/4; 438/109
(58) Field of Search ..................... 438/4, FOR 434, 438/109, FOR 368, FOR 426; 257/686

(56) References Cited

U.S. PATENT DOCUMENTS 5,571,754 A  * 11/1996  Bertin et al. ................. 438/109
5,657,537 A  *  8/1997  Saia et al. .................... 257/686

* cited by examiner

Primary Examiner—David E. Graybill

(57) ABSTRACT

A circuit assembly is formed with a polyimide coated lower SRAM die and an upper die resin bonded to the SRAM die. The repair access opening in the polyimide coating on the upper surface of the SRAM die is filled with polyimide for protection before attaching the upper die to the SRAM die. Embodiments of the present invention including positioning a solid piece of polyimide within the repair access opening or spraying a thin coating of polyimide over the opening and on the first polyimide coating.

20 Claims, 2 Drawing Sheets

STACKED SRAM DIE PACKAGE

RELATED APPLICATIONS

This application claims priority from U.S. Provisional Application Ser. No. 60/214,730, filed Jun. 29, 2000, incorporated herein by reference.

TECHNICAL FIELD

The present invention relates to semiconductor packaging technology. The present invention has particular applicability to semiconductor packages containing a static random access memory (SRAM) die and to manufacturing such packages.

BACKGROUND ART

Ongoing advances in solid-state electronic devices impose continuous demands for integrated circuit devices with increased functionality, density, and performance. In response, multi-chip modules have evolved comprising a printed circuit board substrate to which a series of separate components are directly attached. Multi-chip devices advantageously increase circuit density with attendant improvements in signal propagation speed and overall device weight.

Integrated circuit devices are typically electronically packaged by mounting one or more chips to a ceramic, e.g., alumna circuitized substrate, sometimes referred to as a chip carrier. Wire bonds are employed to electrically connect input/output (IO) contact pads on each chip to corresponding contact pads and to corresponding fan-out circuitry on the circuitized chip carrier substrate. The resulting chip carrier is then typically mounted on a printed circuit board (PCB) and, employing circuitry on the PCB, electrically coupled to other such chip carriers and/or other electronic components mounted on the PCB.

Conventional circuitized substrates contain two or more layers of fan-out circuitry on two or more ceramic layers. Such layers of fan-out circuitry are electrically interconnected by mechanically drilled holes known as vias which are plated and/or filled with electrically conductive material, e.g., copper. Some of the holes extend from the layers of fan-out circuitry to respective lands on the chip carrier substrates, on which are mounted solder balls forming a grid array, thereby generating the expression "ball grid array". The solder balls are mechanically and electrically connected to corresponding solderable contact pads on the PCB.

The continuous increase in the size of large scale integrated circuit chips results in a corresponding increase in the number of I/O connections required to be made to a chip. The increase in the number of I/O connections results in an increase in process complexity since thin wires must be manually or automatically placed between the chips pads and the chip carrier pads for electrical connections.

The trend toward increased functionality, density and performance has also given rise to the practice of superimposing semiconductor dies on a chip carrier substrate. One such stacked die configuration contains a lower die comprising an SRAM semiconductor device and an upper die bonded to the lower die employing a conventional die attach material, such as a non-conductive epoxy resin. However, it was found that such stacked die configurations having a lower SRAM die exhibited an unusual high rejection rate in final reliability testing.

Accordingly, there exists a need for reliable stacked die circuit assembles containing a lower SRAM die. There also exist a need for methodology enabling the manufacture of stacked die circuit assemblies having a lower SRAM die exhibiting high reliability.

SUMMARY OF THE INVENTION

An advantage of the present invention is a highly reliable stacked die circuit assembly with a lower SRAM die.

Another advantage of the present invention is a method of manufacturing a reliable stacked die circuit assembly comprising a lower SRAM die.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a circuit assembly comprising: a substrate having a main surface; a first die having an upper surface and a lower surface attached to the main surface of the substrate, the first die comprising a first polyimide coating on the upper surface of the first die, the first polyimide coating having a repair access opening exposing a portion of an upper surface of the first die; a polyimide material, different from the first polyimide coating, over the opening; and a second die attached to the upper surface of the first die with the first polyimide coating and the polyimide material therebetween.

Another aspect of the present invention is a method of manufacturing a circuit assembly, the method comprising: attaching a lower surface of a first die to a main surface of a substrate, the first die having an upper surface opposite the lower surface and a first polyimide coating on the upper surface of the first die, wherein the first polyimide coating has a repair access opening therein exposing a portion of the upper surface of the first die; covering at least part of the exposed upper portion of the first die with polyimide material; and die attaching a second die to the upper surface of the first die with the first polyimide coating and the polyimide material therebetween.

Embodiments of the present invention comprise a circuit assembly having a lower die comprising an SRAM device with a polyimide coating thereon having a thickness of less than about 1 mil. The polyimide coating has a repair access opening exposing a thin silicon nitride passivation film of the SRAM device. Embodiments of the present invention include covering at least a portion of the exposed silicon nitride passivation film with a solid piece of polyimide loosely or tightly fitting within the repair access opening. Another embodiment of the present invention comprises spraying an additional polyimide coating, having a thickness less than about 1 mil, on the first polyimide coating and into the repair access opening covering the exposed portion of the silicon nitride passivation film.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawing and description is to be regarded as illustrative in nature, and not as restrictive.

BRIEF DESCRIPTION OF THE DRAWING

For convenience of illustration, in FIGS. 1 through 4, similar elements are denoted by similar reference numerals.

DESCRIPTION OF THE PRESENT INVENTION

Figure 1:
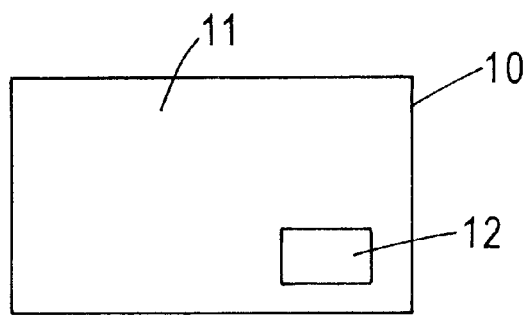
FIG. 1 is a schematic top view illustration of an upper surface of an SRAM die having a repair access opening.

Stack die configurations offer a solution to increased functionality, density and performance required by the continued increase in the size of large scale integrated circuit chips. However, such stack die configurations are limited in situations were the lower die is an SRAM die due to the high rejection rate encountered during final reliability testing.

Upon conducting an investigation of such failures of stack die configurations having a lower SRAM die, it was found that the failures are attributable to damaged metal circuitry in the SRAM die. Upon further investigation, it was noted that a conventional SRAM die is supplied with a thin polyimide coating covering the thin silicon nitride passivation layer for protection. However, a repair access opening is purposely formed within the protective polyimide coating to allow for die repair prior to packaging. Thus, the thin polyimide coating, typically provided by spray coating at a thickness less than about 1 mil, contains a repair access opening of a suitable cross sectional area exposing the thin silicon nitride passivation layer. It was found that upon die attaching an upper die to the lower SRAM die having the repair access opening therein, the die attach nonconductive epoxy resin impinged upon and damaged the silicon nitride passivation layer and damaged the underlying metallization, thereby decreasing reliability.

Having uncovered the source of the reliability problem associated with stack die configurations comprising a lower SRAM die, different approaches to a solution were considered. In accordance with embodiments of the present invention, the reliability and integrity of the lower SRAM die during packaging are maintained by providing an additional polyimide material, apart from the protective polyimide coating, over the exposed silicon nitride passivation layer for protection when die attaching an upper die to the upper surface of the SRAM die, typically employing a nonconductive epoxy resin. Such protection with additional polyimide material can be achieved in a variety of ways, as by inserting into the repair access opening a solid piece of polyimide material which can loosely fit or tightly fit within the opening. Such a piece of protective polyimide material can have a thickness of about 1.5 mils to about 2 mils and can be of any suitable geometric configuration compatible with the repair access opening. For example, embodiments of the present invention include providing a solid piece of polyimide material having a substantially rectangular or square cross sectional area with sides ranging from about 10 mils to about 30 mils. In another embodiment of the present invention, a solid section of polyimide material can be provided having a substantially rectangular cross sectional area with sides ranging from 50 mils to 100 mils.

In another embodiment of the present invention, the additional protective polyimide material can be sprayed on as an additional coating having a thickness less than about 1 mil filling the repair access opening and covering the first polyimide coating.

Figure 2:
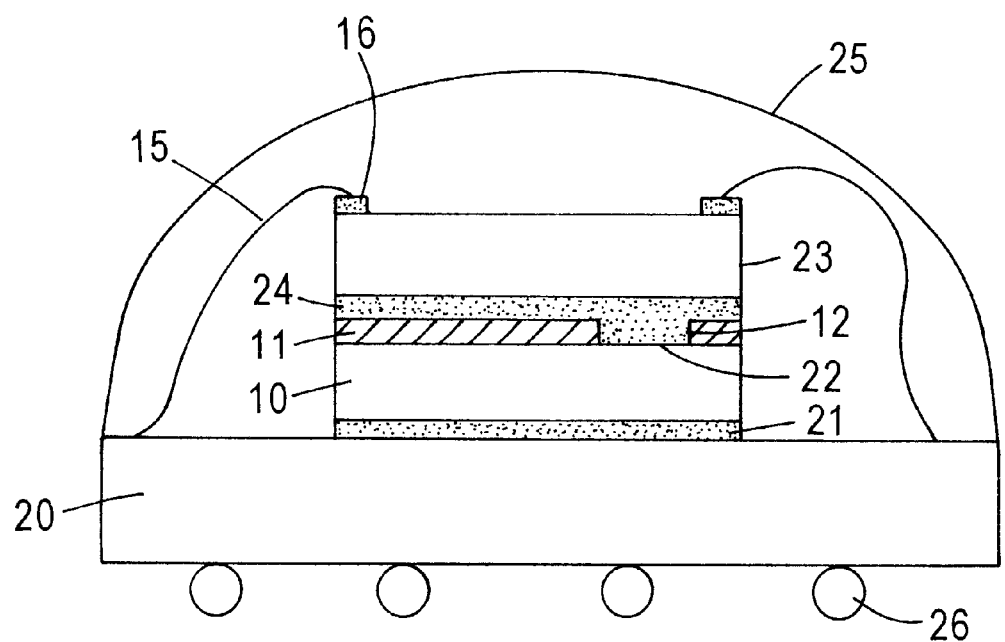
FIG. 2 schematically illustrates a problem attendant upon conventional stacked die packaging having a lower SRAM die.

Adverting to FIG. 1, the upper surface of a conventional SRAM die 10 is illustrated with a polyimide coating 11 thereon having a repair access opening 12 therein which exposes a thin silicon nitride passivation layer on the SRAM device (not shown). A packaged die assembly utilizing such a SRAM with a polyimide coating thereon having a repair access opening as schematically illustrated in FIG. 2. First, SRAM die 10 having a protective polyimide coating 11 thereon with an repair access opening 12 therein is attached to substrate 20 by nonconductive epoxy resin 21. A second die 23 is then attached to the first SRAM die 10 by means of nonconductive epoxy resin 24 which penetrates the repair access opening 12 in the protective polyimide coating 11 causing damage to the upper surface 22 of the SRAM die 10. The completed package as shown in FIG. 2 comprises bond wires 15 wire bonded to bond pads 16 and connected to conductors (not shown) on an upper surface of substrate 20. The dies are encapsulated by a conventional molding compound 25 and subsequently attached to a printed circuit board by means of solder balls 26. Such devices exhibit high rejection rates during reliability testing because of damaged metallization at the upper surface of SRAM die 10 due to attack by the nonconductive epoxy resin 24 through access repair opening 12.

Figure 3:
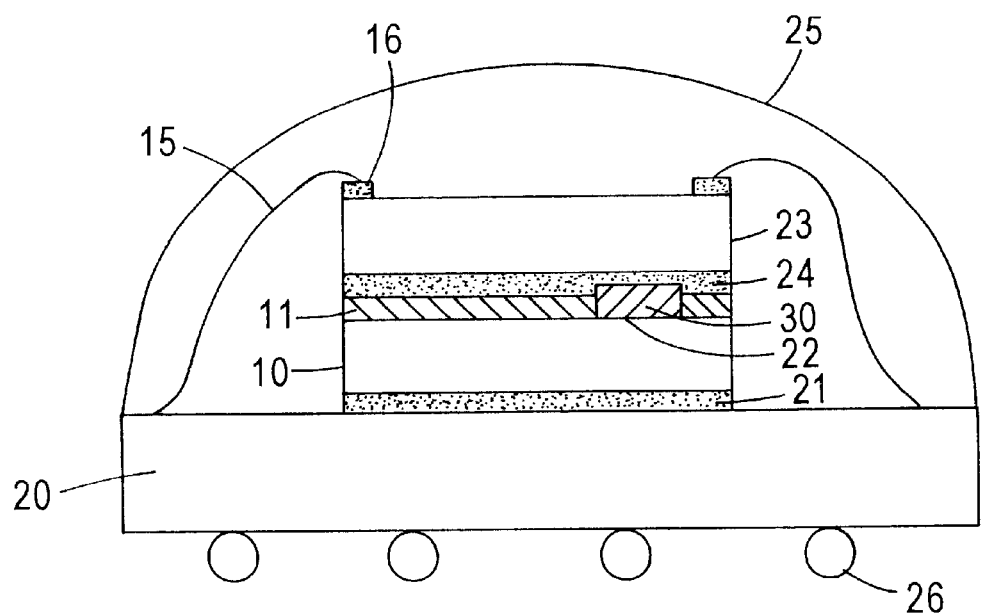
FIG. 3 illustrates a stacked die configuration in accordance with an embodiment of the present invention.

An embodiment of the present invention is illustrated in FIG. 3 wherein elements similar to those in FIG. 2 are denoted by similar reference numerals. Adverting to FIG. 3, the upper surface of lower SRAM die 10 comprises a conventional polyimide coating 11 having a repair access opening therein. However, in accordance with the illustrated embodiment of the present invention, the upper surface 22 of SRAM die 10 exposed by the repair access opening in the protective polyimide coating 11 is protected by additional polyimide material 30, such as a solid piece of polyimide having a thickness of about 1.5 mils to about 5 mils and a substantially square cross sectional shape, e.g., 20 mils by 20 mils. Upon attaching upper die 23 using a nonconductive epoxy resin 24, the upper surface 22 of SRAM die 10 is protected by the additional polyimide material 30 in the repair access opening. Nonconductive epoxy resin 24 can be any resin conventionally employed for die attaching, such as QMI536 obtainable from Quantum Materials, Inc., located in San Diego, Calif.

Figure 4:
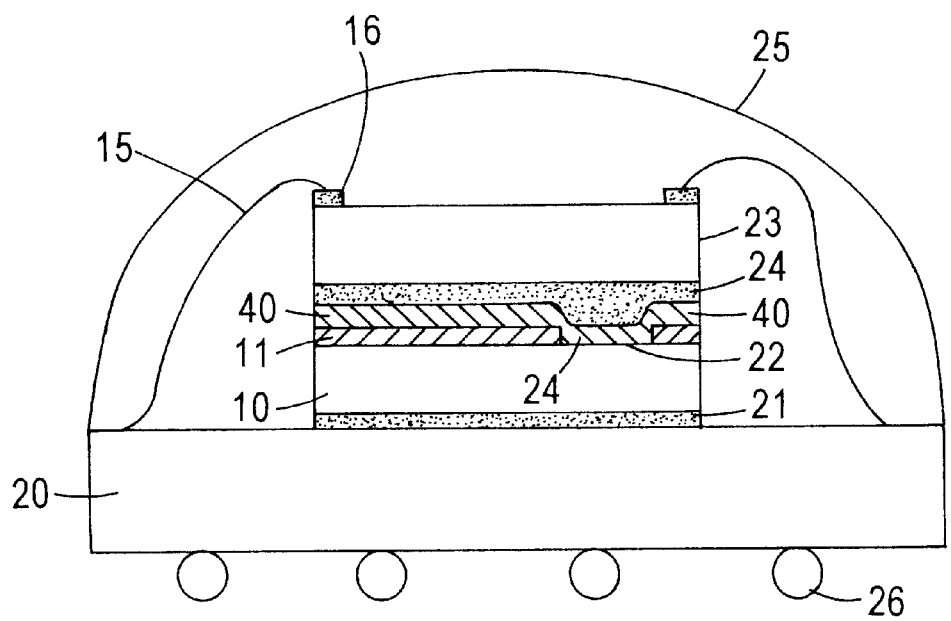
FIG. 4 schematically illustrates a stacked die configuration in accordance with another embodiment of the present invention.

In another embodiment of the present invention as illustrated in FIG. 4, wherein elements similar to those in FIGS. 2 and 3 bear similar reference numerals, the upper surface 22 of lower SRAM die 12 exposed by the repair access opening in the polyimide coating 11 is protected by an additional polyimide coating 40 covering the first polyimide coating 11 and filling the repair access opening. Thus, upon attaching upper die 23 by means of nonconductive epoxy resin 24, the exposed upper surface 22 of SRAM die 10 in the repair access opening is protected by the second polyimide coating 40.

The present invention, therefore, enables the manufacture of packaged die assemblies having a lower SRAM die with high reliability by providing a protective polyimide material in the repair access opening of a polyimide protective coating. The present invention is particularly applicable to integrated circuit packages comprises multi-chip modules.

Only the preferred embodiment of the present invention and an example of its versatility are shown and described in the present invention. It is to be understood that the present invention is capable of use in various other combinations and environments, and is capable of changes or modifications within the scope of the inventive concept as expressed herein.

What is claimed is:

1. A circuit assembly comprising:
   a substrate having a main surface;
   a first die having an upper surface and a lower surface attached to the main surface of the substrate, the first die comprising a first polyimide coating on the upper surface of the first die, the first polyimide coating having a repair access opening exposing a portion of the upper surface of the first die;
   a polyimide material, different from the first polyimide coating, over at least a portion of the opening; and
   a second die attached to the upper surface of the first die with the first polyimide coating and the polyimide material therebetween.

2. The circuit assembly according to claim 1, wherein the first die comprises a static random accessed memory (SRAM) device.

3. The circuit assembly according to claim 2, wherein the first polyimide coating has a thickness less than about 1 mil.

4. The circuit assembly according to claim 2, wherein the repair access opening exposes a silicon nitride passivation layer on the lower die.

5. The circuit assembly according to claim 2, wherein the second die is attached to the first die with a non-conductive epoxy resin.

6. The circuit assembly according to claim 2, wherein the polyimide material comprises a solid piece of polyimide having a thickness of about 1.5 mils to about 5 mils.

7. The circuit assembly according to claim 6, wherein the solid piece of polyimide has a substantially square or substantially rectangular cross sectional shape with sides of about 10 mils to about 30 mils.

8. The circuit assembly according to claim 6, wherein the solid piece of polyimide has a substantially rectangular cross sectional shape with side of about 50 mils to about 100 mils.

9. The circuit assembly according to claim 2, wherein the polyimide material comprises a second polyimide coating on the first polyimide coating and filling the repair access opening, the second polyimide coating having a thickness less than about 1 mil.

10. The circuit assembly according to claim 1, wherein the first polyimide material is a solid piece of polyimide having a cross sectional area less than that of the repair access opening such that the solid piece of polyimide fits loosely into the repair access opening.

11. A method of manufacturing a circuit assembly, the method comprising:
    attaching a lower surface of a first die to a main surface of a substrate, the first die having an upper surface opposite a lower surface and a first polyimide coating on the upper surface of the first die, wherein the first polyimide coating has a repair access opening therein exposing a portion of an upper surface of the first die;
    covering at least part of the exposed upper portion of the first die with polyimide material; and
    attaching a second die to the upper surface of the first die with the first polyimide coating and the polyimide material therebetween.

12. The method according to claim 11, wherein the first die comprising a static random access memory (SRAM) device.

13. The method according to claim 12, wherein the thickness of the first polyimide coating is less than about 1 mil.

14. The method according to claim 12, wherein the repair access opening exposes a silicon nitride passivation layer of the first die.

15. The method according to claim 12, comprising attaching the second die to the upper surface of the first die with a non-conductive epoxy resin.

16. The method according to claim 12, comprising covering at least a portion of the exposed upper surface of the SRAM die with a solid piece of polyimide having a thickness of about 1.5 mils to about 5 mils.

17. The method according to claim 16, wherein the solid piece of polyimide has a substantially square or substantially rectangular cross sectional shape with side of about 10 mils to 30 mils.

18. The method according to claim 16, wherein the solid piece of polyimide material has a substantially rectangular cross sectional shape with sides of about 50 mils to about 100 mils.

19. The method according to claim 12, comprising covering the exposed portion of the upper surface of the SRAM device by spraying a second polyimide coating on the first polyimide coating and filling the repair access opening, wherein the second polyimide coating has a thickness less than about 1 mil.

20. The method according to claim 12, comprising inserting a solid piece of polyimide into the repair access opening such that the solid piece of polyimide material fits loosely therein.

* * * * *